(12) United States Patent
Sugawara

(10) Patent No.: US 7,835,185 B2
(45) Date of Patent: Nov. 16, 2010

(54) NONVOLATILE SEMICONDUCTOR MEMORY DEVICE

(75) Inventor: Hiroshi Sugawara, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 251 days.

(21) Appl. No.: 11/806,961

(22) Filed: Jun. 5, 2007

(65) Prior Publication Data
US 2007/0291544 A1     Dec. 20, 2007

(30) Foreign Application Priority Data
Jun. 12, 2006  (JP)  ............................. 2006-161850

(51) Int. Cl.
*G11C 11/34* (2006.01)
(52) U.S. Cl. ..................... 365/185.19; 365/185.18; 365/226
(58) Field of Classification Search ............ 365/185.18, 365/148, 226, 189.09, 227, 185.22, 185.11, 365/185.29, 185.05, 230.03, 185.19, 185.23
See application file for complete search history.

(56) References Cited

U.S. PATENT DOCUMENTS 5,838,626 A * 11/1998 Nakayama .................. 365/226
2001/0053095 A1* 12/2001 Jinbo ..................... 365/185.25
2006/0262628 A1* 11/2006 Nii et al. ...................... 365/226
2006/0273374 A1* 12/2006 Kobayashi et al. .......... 257/315
2007/0247893 A1* 10/2007 Bednorz et al. ............. 365/148

FOREIGN PATENT DOCUMENTS

| JP | 2000-276882 | 10/2000 |
|----|-------------|---------|
| JP | 2003-507834 | 2/2003  |

* cited by examiner

*Primary Examiner*—Dang T Nguyen
(74) *Attorney, Agent, or Firm*—McGinn IP Law Group, PLLC

(57) ABSTRACT

A nonvolatile semiconductor memory device in accordance with the present invention is provided with a plurality of memory cells of field effect transistor type, a source bias control circuit, and a drain bias control circuit. The source bias control circuit variably sets the potential of a source line connected in common to the sources of the plurality of memory cells at the time of write operation. The drain bias control circuit variably sets the potential of the drains of the plurality of memory cells at the time of write operation according to the potential of the source line.

7 Claims, 3 Drawing Sheets

NONVOLATILE SEMICONDUCTOR MEMORY DEVICE

BACKGROUND OF THE INVENTION

1. Field of the Invention

The present invention relates to a nonvolatile semiconductor memory device. More particularly, the present invention relates to a nonvolatile semiconductor memory device having memory cells of field effect transistor type.

2. Description of the Related Art

In a flash memory, erasure is collectively performed on a group of memory cells included in one sector. However, due to a variation in the erasure characteristic of the memory cell group included in the sector, there may be a memory cell or cells (digit lines) the threshold voltage (hereinafter referenced as "Vtm") of which is 0 V or lower or through which an offset current flows (i.e., the memory cells go to a depletion level) when attention is paid to any single digit line, as the result of erasing operation. Then, when the next write cycle is executed using a channel hot electron (CHE) method, a predetermined write potential is applied to the drains of the memory cell group. At this point, even if a memory cell or a digit line at a depletion level is nonselected (i.e., a control gate potential equals a ground level), an off-leakage current flows through the memory cell. If the off-leakage current flows from the nonselected memory cell to the bit line, a sufficient write current does not flow through a selected memory cell or cells to be written, thus deteriorating the write characteristic of the flash memory.

As one of measures against such problems as described above, "source bias writing" has been put in practical use. According to the source bias writing, a predetermined positive potential is applied in a write operation to a common source line connected in common to a group of memory cells. As a result, the threshold voltage Vtm rises due to a substrate effect and an off-leakage current flowing through a nonselected memory cell or cells are suppressed.

As a conventional art relating to source potential control, there are known the techniques described in National Publication of International Patent Application No. 2003-507834 and Japanese Patent Laid-Open No. 2000-276882. According to the flash memory device described in National Publication of International Patent Application No. 2003-507834, an array of resistors is connected between a common source line and a ground. At the time of writing memory cells, a resistor value is selected and the source potential rises. According to the nonvolatile semiconductor memory device described in Japanese Patent Laid-Open No. 2000-276882, a predetermined bias voltage is applied to a common source line at the time of reading memory cells.

The inventor of the present invention is the first to focus on the following. That is, when the write-erase cycle of memory cells is repeated, the threshold voltage of a memory cell or cells at a depletion level may lower further. At this point, it is possible to further increase the source potential in source bias writing in order to weaken the effect of the threshold voltage. However, if the source voltage exceeds a certain level, it is no longer possible to secure a sufficient drain-source voltage Vds at a memory cell or cells. As a result, a desired write current does not flow through the selected memory cell or cells to be written. This results in a remarkable deterioration in the write characteristic or an inability to write.

SUMMARY

In one embodiment the nonvolatile semiconductor memory device (1) in accordance with the present invention is provided with a plurality of memory cells (2) of field effect transistor type, a source bias control circuit (10), and a drain bias control circuit (20). The source bias control circuit (10) variably sets the potential (VCS) of a source line (3) connected in common to the sources of the plurality of memory cells (2) at the time of write operation. The drain bias control circuit (20) variably sets the potential (VD) of the plurality of memory cells (2) at the time of write operation, according to the potential (VCS) of the source line (3).

In this way, according to the nonvolatile semiconductor memory device (1) in accordance with the present invention, the potential (VD) appropriate for the potential (VCS) of the source line (3) is applied to the drains of the plurality of memory cells (2). The drain potential (VD) also rises as the source potential (VCS) rises.

DETAILED DESCRIPTION OF THE PREFERRED EMBODIMENTS

Now, an explanation will be made of a nonvolatile semiconductor memory device in accordance with embodiments of the present invention by referring to the accompanying drawings. The nonvolatile semiconductor memory device in accordance with the present embodiment is, for example, a NOR-type flash memory.

1. First Embodiment

Figure 1:
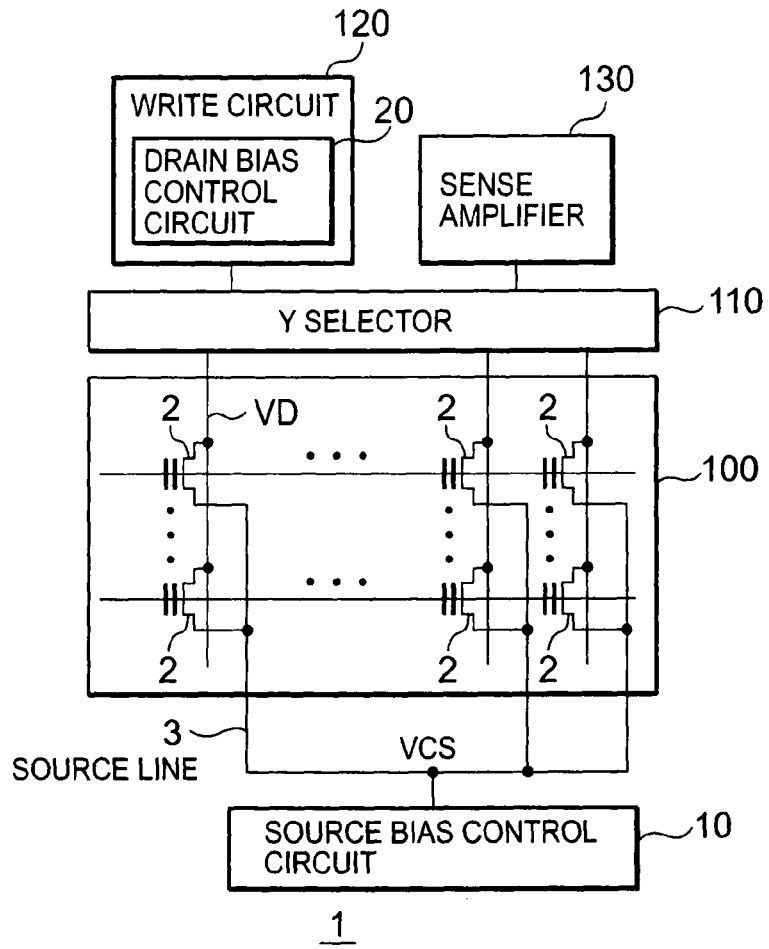
FIG. 1 is a block diagram illustrating the configuration of a nonvolatile semiconductor memory device in accordance with the first embodiment of the present invention.

FIG. 1 illustrates the configuration of a nonvolatile semiconductor memory device 1 in accordance with the first embodiment of the present invention. The nonvolatile semiconductor memory device 1 is provided with a sector 100, a Y selector 110, a write circuit 120, and a sense amplifier 130. The sector 100 is a unitary block on which a collective erasure is performed and has a plurality of memory cells 2. Each memory cell 2 is a nonvolatile memory cell of field effect transistor type. For example, the memory cell 2 is a stack-type or split-gate type memory cell having a floating gate and a control gate. Alternatively, the memory cell 2 may be a MONOS having an ONO film as a charge storage film. The sources of these memory cells 2 are connected in common to the source line 3. In addition, the drains of the plurality of memory cells 2 are connected to the write circuit 120 and the sense amplifier 130 through the Y selector 110.

As the result of erasing operation, an off-leakage current flows if any memory cell 2 at a depletion level occurs. Specifically the depletion level is a memory cell's threshold voltage which is less than 0V. That means a threshold voltage of the memory cell becomes depletion level, the off-leakage current flow via a non-selected memory cell when a selected memory cell is in write mode. In order to suppress the off-leakage currents "source bias writing" is employed. For this reason, the nonvolatile semiconductor memory device 1 is provided with a source bias control circuit 10 for controlling the potential VCS of the source line 3. At the time of write operation, the source bias control circuit 10 sets the source potential VCS to a positive level. As a result, the threshold voltage Vtm rises due to a relative substrate effect, thus suppressing the off-leakage current.

When the write-erase cycle of memory cells 2 is repeated, the current characteristic of the memory cells deteriorate and the substantial threshold voltage Vtm lowers further. As a result, an offset current increases in some cases. Accordingly, the source bias control circuit 10 increases the source potential VCS further. Preferably, a current flowing through the source line 3 should be detected and the source potential VCS should be variably controlled according to the total amount of the current. More specifically, the larger the amount of current flowing through the source line 3 is, the higher the source bias control circuit 10 sets the source potential VCS. The VCS must be setting to suit a current changing in response to every write-erase cycle.

However, if the source potential VCS exceeds a certain level, it is no longer possible to secure a sufficient drain-source voltage Vds (it called a write voltage) at the memory cells 2. This causes a deterioration in the write characteristic. Accordingly, the write circuit 120 in accordance with the present embodiment is provided with a drain bias control circuit 20 for controlling the drain potential VD of the memory cells 2. The drain bias control circuit 20 can variably set the drain potential VD according to the source potential VCS. More specifically, the higher the source potential VCS rises, the higher the drain bias control circuit 20 sets the drain potential VD. As described above the drain bias control circuit and the source bias control circuit correlate to each other, said circuits is called a data write circuit.

Figure 2:
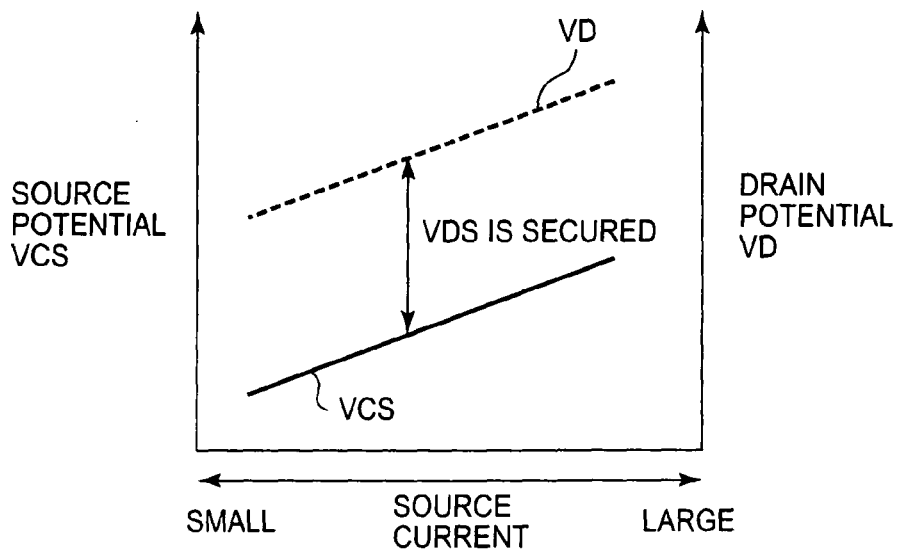
FIG. 2 is a graphical view schematically illustrating the concept of the present invention.

FIG. 2 schematically illustrates the concept of the present embodiment. The source bias control circuit 10 detects the total current flowing through the source line 3 and determines the source potential VCS according to the total current. More specifically, the larger the total current value is, the higher the source bias control circuit 10 sets the source potential VCS. In addition, the higher the source potential VCS is, the higher the drain bias control circuit 20 sets the drain potential VD. As a result, as illustrated in FIG. 2, it is possible to secure a sufficient drain-source voltage Vds. Consequently, a desired write current flows through selected memory cells to be written, thus preventing a write failure.

2. Second Embodiment

Figure 3:
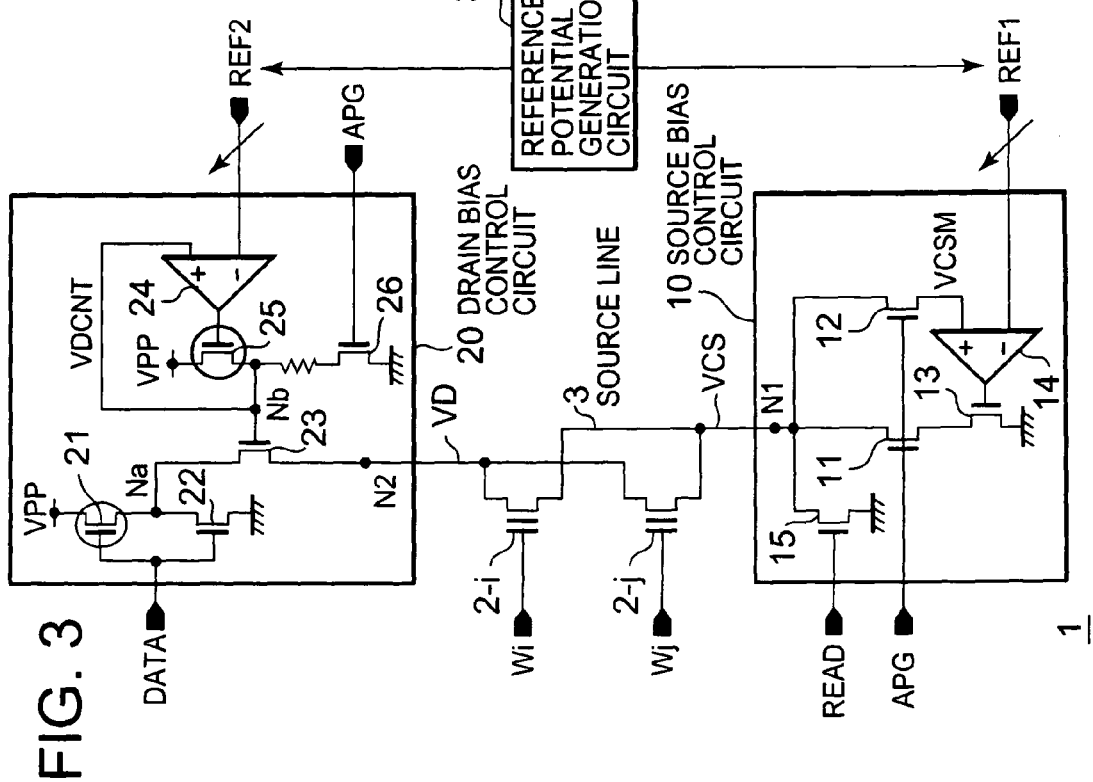
FIG. 3 is a circuit diagram illustrating the configuration of a nonvolatile semiconductor memory device in accordance with the second embodiment of the present invention.

FIG. 3 is a circuit diagram illustrating the configuration of a nonvolatile semiconductor memory device 1 in accordance with the second embodiment of the present invention. FIG. 3 illustrates only the relevant parts of the present invention and the Y selector 110, the write circuit 120, the sense amplifier 130 and the like shown in FIG. 1 are excluded from the illustration.

In FIG. 3, there are shown two memory cells 2-$i$ and 2-$j$ as representative examples. Word lines Wi and Wj are respectively connected to the control gates of the memory cells 2-$i$ and 2-$j$. In addition, a source line 3 is connected in common to the sources of the memory cells 2-$i$ and 2-$j$. The source line 3 is connected to a node N1, whereas the drains of the memory cells 2-$i$ and 2-$j$ are connected to a node N2.

A source bias control circuit 10 is a circuit intended to set the potential of the node N1, i.e., the potential VCS of the source line 3. In order to suppress an off-leakage current at the time of write operation, the source bias control circuit 10 sets a source potential VCS to a positive level. In addition, in the present embodiment, the source bias control circuit 10 can variably set the source potential VCS.

In FIG. 3, there is also shown a configuration of the source bias control circuit 10 by way of example. The source bias control circuit 10 illustrated in FIG. 3 is provided with N-channel MOS transistors (hereinafter referenced as NMOSs) 11, 12, 13 and 15 and a differential amplifier circuit 14. The turning on/off of the NMOSs 11 and 12 is controlled by a program signal APG. The NMOS 11 is interposed between the node N1 and the NMOS 13 and the NMOS 12 is interposed between the node N1 and one input of the differential amplifier circuit 14. A variable reference potential REF1 is supplied to the other input of the differential amplifier circuit 14. The output of the differential amplifier circuit 14 is connected to the gate of the NMOS 13. The NMOS 13 is interposed between the NMOS 11 and the ground. A feedback loop for controlling the NMOS 13 is formed by such connection as described above. The NMOS 15 is interposed between the node N1 and the ground, wherein the turning on/off of the NMOS 15 is controlled by a read signal READ.

A drain bias control circuit 20 is a circuit intended to set the potential of the node N2, i.e., the drain potential VD of the memory cells 2. In the present embodiment, the drain bias control circuit 20 can variably set the drain potential VD. The drain potential VD is associated with the source potential VCS described above and varies according to the potential VCS. For example, the drain potential VD also rises as the source potential VCS rises. In this way, the drain bias control circuit 20 in accordance with the present embodiment variably sets the drain potential VD at the time of write operation according to the potential VCS of the source line 3.

In FIG. 3, there is also shown a configuration of the drain bias control circuit 20 by way of example. The drain bias control circuit 20 shown in FIG. 3 is provided with P-channel MOS transistors (hereinafter referenced as PMOSs) 21 and 25, NMOSs 22, 23 and 26, and a differential amplifier circuit 24. The PMOS 21 and the NMOS 22 configure an inverter and the inverter is interposed between an input terminal whereto write data DATA is input and a node Na. Accordingly, a potential appropriate for the write data DATA is applied to the node Na. The NMOS 23 is interposed between the node Na and the node N2. The gate of the NMOS 23 is connected to a node Nb and is controlled by the potential of the node Nb.

The node Nb is connected to one input of the differential amplifier circuit 24. A variable reference potential REF2 is supplied to the other input of the differential amplifier circuit 24. The output of the differential amplifier circuit 24 is connected to the gate of the PMOS 25. The PMOS 25 is interposed between the node Nb and the power supply. The NMOS 26 is interposed between the node Nb and the ground and the turning on/off of the NMOS 26 is controlled by the program signal APG. A feedback loop for controlling the PMOS 25 is formed by such connection as described above. The differential amplifier circuit 24, the PMOS 25 and the NMOS 26 which control the potential of the node Nb, i.e., the gate potential of the NMOS 23 may be hereinafter collectively referenced as a "gate potential control circuit."

The nonvolatile semiconductor memory device 1 is further provided with a reference potential generation circuit 30. The reference potential generation circuit 30 is a circuit intended to generate the reference potentials REF1 and REF2. The reference potentials REF1 and REF2 to be generated are variable and have a correlation with each other.

Now, an explanation will be made of the write operation of the nonvolatile semiconductor memory device 1 by referring to FIG. 3. In a write operation, the program signal APG is activated and the read signal READ is deactivated. The program signal APG is input to the source bias control circuit 10, the drain bias control circuit 20 and the reference potential generation circuit 30, wherein each circuit is activated by the program signal APG.

In response to the activated program signal APG, the reference potential generation circuit 30 generates the reference potentials REF1 and REF2. Note here that these reference potentials REF1 and REF2 can be set variably in such a manner that they have a correlation with each other. For example, the reference potential REF2 is directly proportional to the reference potential REF1 and increases as the reference potential REF1 rises. The reference potentials REF1 and REF2 may be set to the same value. In this case, the configuration of the reference potential generation circuit 30 is simplified and is therefore preferable. The generated reference potentials REF1 and REF2 are respectively supplied to the source bias control circuit 10 and the drain bias control circuit 20.

The source bias control circuit 10 sets the source potential VCS according to the supplied reference potential REF1. On the other hand, the drain bias control circuit 20 sets the drain potential VD according to the supplied reference potential REF2. Since the reference potentials REF1 and REF2 have a correlation with each other, the source potential VCS and the drain potential VD have also a correlation with each other. More specifically, the correlation is as follows.

In the source bias control circuit 10, the NMOSs 11 and 12 turn on when the program signal APG is activated. The output of the differential amplifier circuit 14 controls the NMOS 13. The node N1 is charged or discharged by the control of the NMOS 13. In addition, a feedback potential VCSM from the node N1 and the reference potential REF1 described above are input to the differential amplifier circuit 14. By such control as described above, the potential VCS of the node N1 is maintained at the reference potential REF1. More specifically, the source bias control circuit 10 compares the reference potential REF1 with the source voltage VCS and maintains the source potential VCS at the reference potential REF1 irrespective of a memory cell write current. When the reference potential REF1 is changed, the source potential VCS also varies. Consequently, the source bias control circuit 10 can variably set the source potential VCS according to the reference potential REF1. In order to suppress an off-leakage current at the time of writing, the source potential VCS, i.e., the reference potential REF1 should preferably be set to a positive level (REF1>0).

On the other hand, write data "0" is input to the drain bias control circuit 20. As a result, a high-level potential VPP is applied to the node Na.

In the drain bias control circuit 20, the NMOS 26 turns on when the program signal APG is activated. The output of the differential amplifier circuit 24 controls the PMOS 25. The node Nb is charged or discharged by the control of the PMOS 25. In addition, the potential VDCNT of the node Nb and the reference potential REF2 are input to the differential amplifier circuit 24. By such control as described above, the potential VDCNT of the node Nb is maintained at the reference potential REF2. In other words, the gate potential control circuit applies the reference potential REF2 to the gate of the NMOS 23. When the reference potential REF2 rises, the gate potential VDCNT of the NMOS 23 also rises. As a result, the potential VD of the node N2 also rises.

A word line (for example, a word line Wi) leading to a memory cell 2 to be written (for example, a memory cell 2-i) is selected. When the source potential VCS and the drain potential VD are respectively applied to the source and drain of the memory cell 2-i, hot electrons occur in the channel region. These hot electrons are injected into a charge storage portion such as a floating gate, causing the threshold voltage Vtm to rise. In this way, the write data "0" is written to the memory cell 2.

As described above, the source potential VCS also rises as the reference potential REF1 rises. Since the reference potential REF2 having a correlation with the reference potential REF1 also rises concurrently, the drain potential VD also rises. In this way, the source potential VCS and the drain potential VD are associated with each other through the reference potentials REF1 and REF2 and the drain potential VD is adjusted according to the source potential VCS. Consequently, even if the source potential VCS is set to a relatively higher level in order to suppress an off-leakage current, a sufficient drain-source voltage is secured at the memory cell 2. By virtue of the sufficient drain-source voltage, a sufficient write current flows through the selected memory cell to be written, thus preventing a write failure.

The reference potentials REF1 and REF2 may be set to different values according to a given write mode. Write modes include a normal write mode, a pre-erasure write mode, and a post-erasure write-back mode. As shown in FIG. 3, a mode signal MODE indicative of these modes is input to the reference potential generation circuit 30. The reference potential generation circuit 30 varies the reference potentials REF1 and REF2 according to the mode signal MODE. For example, in a post-erasure write-back mode, there is a high possibility that a memory cell or cells at a depletion level are present. Therefore, the reference potential generation circuit 30 sets the reference potential REF1 to a relatively higher level. Accordingly, the reference potential generation circuit 30 also sets the reference potential REF2 to a relatively higher level. This corresponds to the concept illustrated in FIG. 2. In that case, the off-leakage current is suppressed by the relatively higher source potential VCS. In addition, an excellent write operation is realized by the sufficient drain-source voltage Vds.

Figure 4:
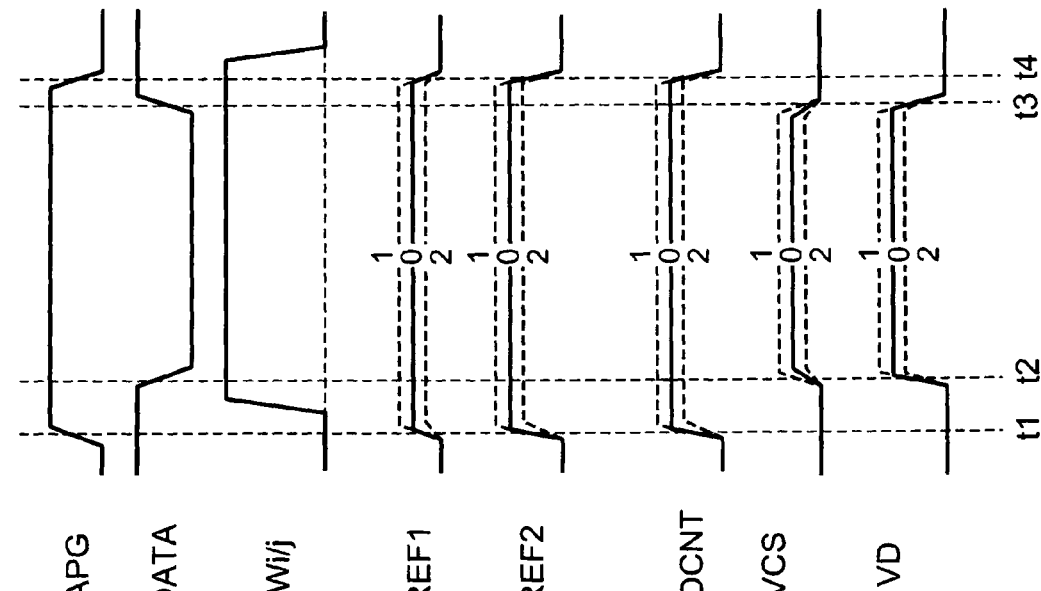
FIG. 4 is a timing chart illustrating the write operation of a nonvolatile semiconductor memory device in accordance with the second embodiment.

FIG. 4 is a timing chart illustrating a write operation in accordance with the present embodiment. At a time t1, a program signal APG is activated. In response to this activation, reference potentials REF1 and REF2 are generated. These reference potentials REF1 and REF2 can be set variably in such a manner that they have a correlation with each other. In other words, as indicated by an additional numeral "1" in the figure, the reference potential REF2 is also set to a relatively higher level when the reference potential REF1 is set to a relatively higher level. Likewise, as indicated by an additional numeral "2" in the figure, the reference potential REF2 is also set to a relatively lower level when the reference potential REF1 is set to a relatively lower level. Additional numerals "0," "1" and "2" correspond to different write modes, respectively. The potential VDCNT of a node Nb is also set variably according to the reference potential REF2.

Thereafter, a word line (Wi, Wj) leading to the memory cell 2 to be written is selected. Then, at a time t2, write data "0" is input. The source potential VCS rises to a positive potential appropriate for the reference potential REF1. In addition, the drain potential VD rises to a positive potential appropriate for the reference potential REF2, i.e., the source potential VCS. At a time t3, input of the write data "0" ends and the drain potential VD and the source potential VCS return to a ground level. At a time t4, the program signal APG is deactivated and writing ends.

Note that at the time of read operation, the read signal READ is activated and the program signal APG is deactivated. In the source bias control circuit 10, the NMOS 15 turns on and the potential VCS of the source line 3 is set to the ground level. A predetermined potential is applied by an unillustrated readout circuit to the drain of the memory cell 2 to be read.

As heretofore described, according to the nonvolatile semiconductor memory device 1 in accordance with the present embodiment, the drain potential VD applied to the drain of the memory cell 2 is adjusted according to the source potential VCS. The drain potential VD also rises as the source potential VCS rises. Consequently, it is possible to secure a sufficient drain-source voltage at the time of writing the memory cell 2. As a result, a desired write current flows through a selected memory cell or cells to be written, thus preventing a write failure. In the case of source bias writing in particular, the source potential is set to a relatively higher level in order to suppress an off-leakage current. A sufficient drain-source voltage is secured even in such a case, thus preventing a deterioration in the write characteristic and suppressing an overhead in write time.

3. Third Embodiment

Figure 5:
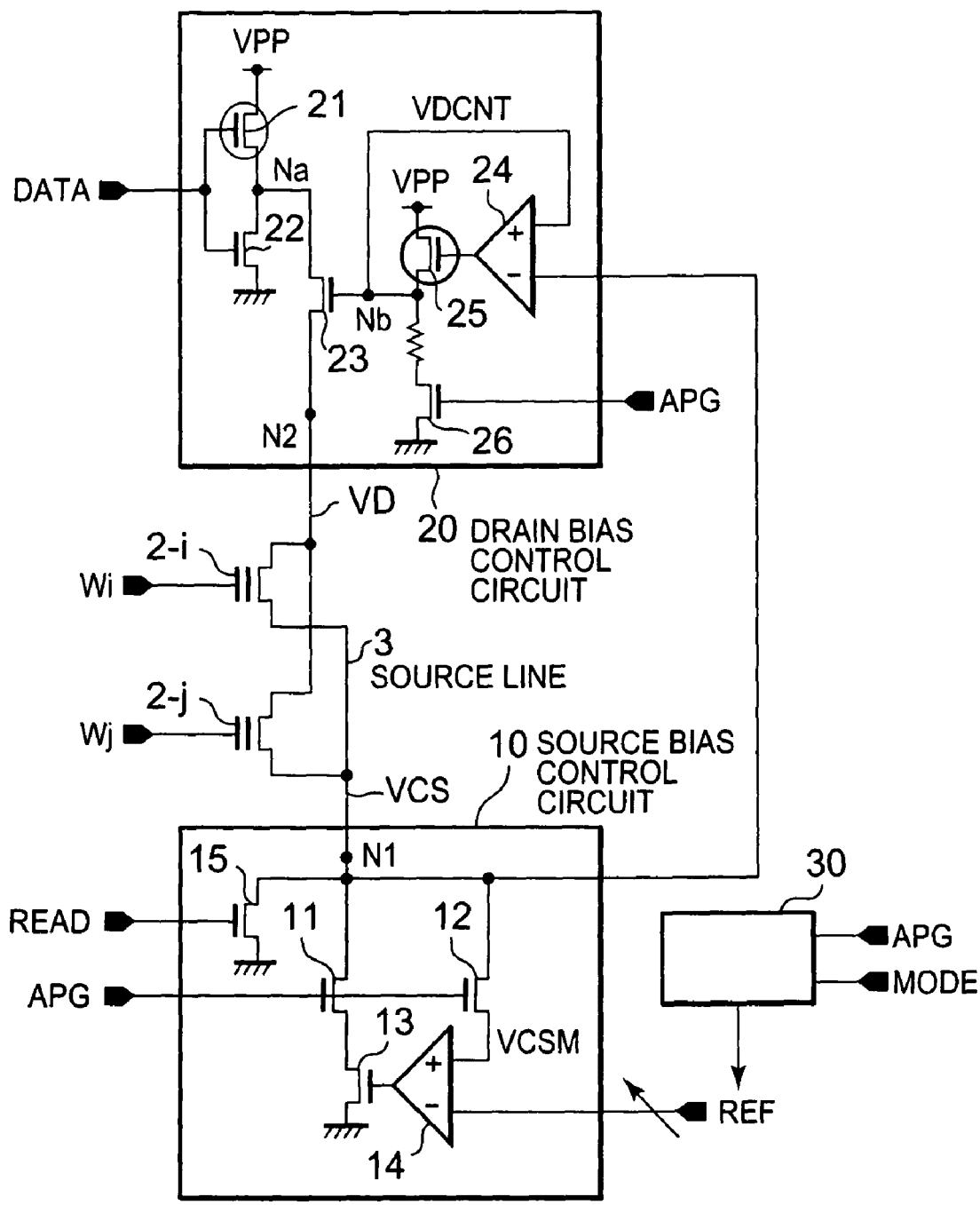
FIG. 5 is a circuit diagram illustrating the configuration of a nonvolatile semiconductor memory device in accordance with the third embodiment of the present invention.

FIG. 5 is a circuit diagram illustrating the configuration of a nonvolatile semiconductor memory device 1 in accordance with the third embodiment of the present invention. In FIG. 5, constituent elements identical to those of FIG. 3 are referenced alike and their descriptions are omitted as appropriate.

In the present embodiment, a node N1 leading to a source line 3 is connected to an input of the differential amplifier circuit 24 of a drain bias control circuit 20. Consequently, the potential VCS of the source line 3 is directly supplied to the drain bias control circuit 20. This means that a gate potential control circuit in the drain bias control circuit 20 applies the source potential VCS to a node Nb, i.e., the gate of an NMOS 23. The potential of the node N2, i.e., the drain potential VD varies according to the gate potential of the NMOS 23. In this way, the drain bias control circuit 20 in accordance with the present embodiment automatically detects the source potential VCS and sets the drain potential VD according to the source potential VCS. The drain potential VD varies keeping track of the source potential VCS.

The potential VCS of the source line 3 can be set arbitrarily. It is also acceptable that the source bias control circuit 10 varies the source potential VCS according to a given write mode. For example, the reference potential generation circuit 3b generates different potentials REF according to the mode signal MODE indicative of a write mode, as with the second embodiment. The source bias control circuit 10 variably sets the source potential VCS according to the reference potential REF. For this reason, the source potential VCS varies depending on the write mode. Accordingly, the drain potential VD also varies depending on the write mode. Write modes include a normal write mode, a pre-erasure write mode, and a post-erasure write-back mode. For example, in a post-erasure write-back mode, the reference potential generation circuit 30 sets the reference potential REF to a relatively higher level. This corresponds to the concept illustrated in FIG. 2. In that case, the off-leakage current is suppressed by the relatively higher source potential VCS. In addition, an excellent write operation is realized by the sufficient drain-source voltage Vds.

According to the present embodiment, the same effect as those of the already described embodiments is obtained. Furthermore, since the source potential VCS is directly supplied to the drain bias control circuit 20, a circuit configuration for associating the source potential VCS with the drain potential VD is simplified.

According to the nonvolatile semiconductor memory device in accordance with the present invention, a deterioration in the write characteristic is prevented.

It is apparent that the present invention is not limited to the above embodiments, but may be modified and changed without departing from the scope and spirit of the invention.

What is claimed is:

1. A semiconductor memory device comprising:
a memory cell array including a common line and a plurality of memory cells, all of sources of said memory cells being connected in common to said common line; and
a data write circuit responsive to write mode to perform a data write operation by using a channel hot electron method on said memory cells, said data write circuit being operable to supply a variable potential to one of a drain of said memory cells in response to a potential of said common line in said write mode.
wherein said data write circuit secures a drain-source voltage to prevent a selected cell from being failure in said write mode.

2. The nonvolatile semiconductor memory device according to claim 1, wherein at least one of said memory cells has an off-leakage current.

3. The nonvolatile semiconductor memory device according to claim 1, wherein a threshold voltage of said memory cell is at a depletion level.

4. The nonvolatile semiconductor memory device according to claim 1, wherein at least one of said memory cells comprises an unselected cell.

5. The nonvolatile semiconductor memory device according to claim 1, wherein said data write circuit includes a drain bias control circuit and a source bias control circuit.

6. The semiconductor memory device according to claim 5, wherein said drain bias control circuit sets a potential of a drain of said memory cell to a higher level in response to said common line rises.

7. The semiconductor memory device according to claim 5, wherein said source bias control circuit sets a potential of said common line to a positive level.

* * * * *